US008169351B2

(12) United States Patent
Lee

(10) Patent No.: US 8,169,351 B2
(45) Date of Patent: May 1, 2012

(54) FEEDBACK CIRCUITS WITH DC OFFSET CANCELLATION

(75) Inventor: Chun Lee, Ann Arbor, MI (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/605,034

(22) Filed: Oct. 23, 2009

(65) Prior Publication Data

US 2011/0095924 A1    Apr. 28, 2011

(51) Int. Cl.
*H03M 3/00*    (2006.01)
(52) U.S. Cl. .................. 341/143; 341/155; 341/156
(58) Field of Classification Search .............. 341/61, 341/143, 155, 156
See application file for complete search history.

(56) References Cited

U.S. PATENT DOCUMENTS

| | | | | |
|---|---|---|---|---|
| 6,107,947 A * | 8/2000 | Lyden | ............. | 341/143 |
| 6,392,493 B1 * | 5/2002 | Minnis | ............. | 331/1 A |
| 6,580,376 B2 * | 6/2003 | Perrott | ............. | 341/61 |
| 6,920,182 B2 * | 7/2005 | Bolton, Jr. | ........ | 375/247 |
| 6,975,259 B1 | 12/2005 | Jensen | | |
| 7,279,990 B2 * | 10/2007 | Hasegawa | ....... | 331/16 |
| 2003/0020640 A1 * | 1/2003 | Perrott | ............ | 341/61 |

FOREIGN PATENT DOCUMENTS

JP      10209873 A     8/1998
WO    WO0165698 A1   9/2001

OTHER PUBLICATIONS

Silva et al., "Low-Distortion Delta-Sigma Topologies for Mash Architectures", ISCAS 2004, pp. I-1144-I-1147, Oregon State University, Corvallis, Oregon, USA.
Christian C Enz et al., "Circuit Techniques for Reducing the Effects of Op-Amp Imperfections: Autozeroing, Correlated Double Sampling, and Chopper Stabilization", Proceedings of the IEEE, IEEE, New York, US, vol. 84, No. 11, Nov. 1, 1996, XP011043780, ISSN: 0018-9219.
International Search Report and Written Opinion—PCT/US2010/053866, International Search Authority—European Patent Office—Mar. 9, 2011.

* cited by examiner

*Primary Examiner* — Jean B Jeanglaude
(74) *Attorney, Agent, or Firm* — Kevin T. Cheatham

(57) ABSTRACT

Feedback circuits with DC offset cancellation are described. In an exemplary design, a feedback circuit includes a slow integrator and a summer. The slow integrator receives a first intermediate signal at a particular point in the feedback circuit and provides a second intermediate signal. The summer is located after the particular point and receives and sums the first and second intermediate signals to reduce DC offset in the first intermediate signal. In one design, the feedback circuit may be a delta-sigma (ΔΣ) modulator with at least one integrator coupled in cascade. The slow integrator is coupled to the output of the last integrator, receives the first intermediate signal from the last integrator, and provides the second intermediate signal. The summer is coupled to the last integrator and the slow integrator and sums the first and second intermediate signals to reduce DC offset in the first intermediate signal.

25 Claims, 7 Drawing Sheets

US 8,169,351 B2

FEEDBACK CIRCUITS WITH DC OFFSET CANCELLATION

BACKGROUND

I. Field

The present disclosure relates generally to electronics, and more specifically to feedback circuits.

II. Background

A feedback circuit is a circuit in which an output signal is fed back and used to control the operation of the circuit. Feedback circuits are commonly used for various applications such as delta-sigma (ΔΣ) modulators, phase lock loops (PLLs), etc. Different overall functions may be obtained for feedback circuits by using different transfer functions in the forward and feedback paths of the feedback circuits.

A feedback circuit may be implemented with various circuit blocks such as amplifiers, summers, quantizers, etc. Ideally, an amplifier should have zero input offset, so that the output of the amplifier is zero when the input is zero. However, an amplifier typically has some input offset, which would result in the output being non-zero when the input is zero.

In general, the presence of input offsets in circuit blocks of a feedback circuit may lead to direct current (DC) offsets at various points in the feedback circuit. DC offset generally refers to a static value and may be for voltage or current. DC offset may be relatively large at certain points in the feedback circuit. A large DC offset at an output of a circuit block may be undesirable since the DC offset may cut into an output signal range of the circuit block. The circuit block may then have to support the DC offset as well as a desired signal. The DC offset may reduce the signal range of the circuit block and may degrade the performance of the feedback circuit.

SUMMARY

Feedback circuits with DC offset cancellation are described herein. In an exemplary design, a feedback circuit may comprise a slow integrator and a summer. The slow integrator may have a gain of less than one, e.g., less than 0.1, less than 0.01, etc. The slow integrator may receive a first intermediate signal at a particular point in the feedback circuit and may provide a second intermediate signal. The summer may be located after the particular point and may receive and sum the first and second intermediate signals to reduce DC offset in the first intermediate signal.

In another exemplary design, a ΔΣ modulator (which is one type of feedback circuit) may comprise at least one integrator coupled in cascade, a slow integrator, and a summer. The slow integrator may be coupled to the output of the last integrator, may receive a first intermediate signal from the last integrator, and may provide a second intermediate signal. The summer may be coupled to the last integrator and the slow integrator and may sum the first and second intermediate signals to reduce DC offset in the first intermediate signal.

Various aspects and features of the disclosure are described in further detail below.

DETAILED DESCRIPTION

The feedback circuits with DC offset cancellation described herein may be used for ΔΣ modulators, PLLs, etc. For clarity, certain aspects of DC offset cancellation are described below for ΔΣ modulators, which are widely used for various applications such as analog-to-digital converters (ADCs), digital-to-analog converters (DACs), etc. A ΔΣ modulator may receive an analog input signal and generate a digital output signal with one or few bits at a high output sample rate. The ΔΣ modulator can generate the digital output signal using a quantizer having one or few bits of resolution and can thus achieve good linearity. Furthermore, the ΔΣ modulator can spectrally shape quantization noise such that most of the noise is pushed away from a desired signal band toward higher frequencies. The out-of-band noise at higher frequencies can be more easily filtered with a simple analog filter.

ΔΣ modulators may be implemented with various topologies or architectures such as a cascade of integrators feedforward (CIFF) topology, a cascade of integrators with feedback (CIFB) topology, a multi-stage noise shaping (MASH) topology, etc. For clarity, some ΔΣ modulators implemented with CIFF and MASH topologies are described below.

Figure 1:
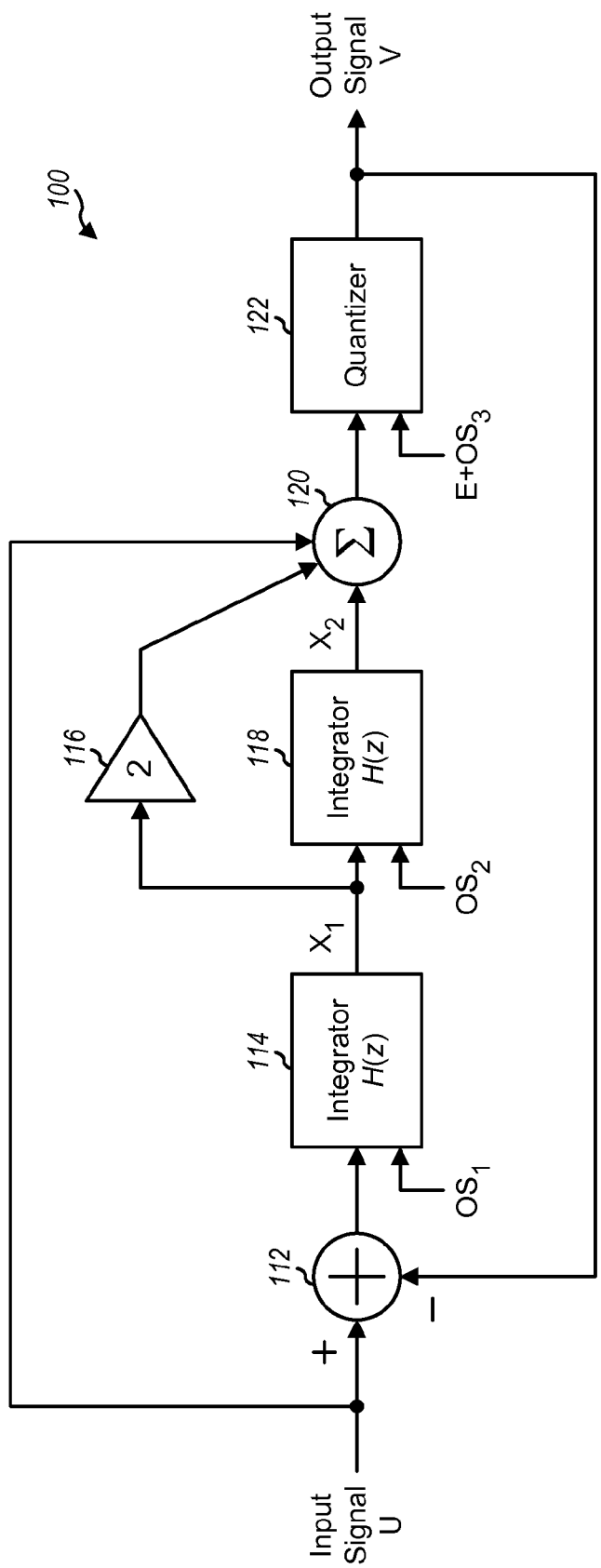
FIG. 1 shows a single-stage ΔΣ modulator without DC offset cancellation.

FIG. 1 shows a block diagram of a second-order CIFF ΔΣ modulator 100 without DC offset cancellation. Within ΔΣ modulator 100, a summer 112 receives an analog input signal U and a digital output signal V from a quantizer 122, subtracts the output signal from the input signal, and provides an error signal. A first integrator 114 integrates the error signal and provides a first intermediate signal $X_1$. A second integrator 118 integrates the first intermediate signal and provides a second intermediate signal $X_2$ to a summer 120. A multiplier 116 scales the first intermediate signal by a factor of two and provides its output to summer 120. Summer 120 sums the analog input signal, the output of multiplier 116, and the second intermediate signal. Quantizer 122 quantizes the output of summer 120 to one or more bits and provides the digital output signal. All of the signals in FIG. 1 may be analog signals except for the digital output signal.

Each integrator may have a transfer function of H(z) in the z-domain, which may be expressed as:

$$H(z) = \frac{z^{-1}}{1-z^{-1}}, \qquad \text{Eq (1)}$$

where $z^{-1}$ denotes a delay of one sample period.

If the circuit blocks in ΔΣ modulator 100 have no input offsets, then the intermediate signals and the output signal in ΔΣ modulator 100 may be expressed as:

$$V = U + (1-z^{-1})^2 \cdot E, \qquad \text{Eq (2)}$$

$$X_1 = -z^{-1} \cdot (1-z^{-1}) \cdot E, \text{ and} \qquad \text{Eq (3)}$$

$$X_2 = -z^{-2} \cdot E, \qquad \text{Eq (4)}$$

where E denotes quantization error or noise due to quantization of the output of summer 120 to one or few bits by quantizer 122.

As shown in equation (2), the output signal V is equal to the input signal U plus filtered quantization noise. Summer 112 subtracts the output signal from the input signal and provides the error signal, which comprises only quantization noise. Integrators 114 and 118 then process the quantization noise with a desired noise shaping transfer function. The first intermediate signal $X_1$ comprises filtered and delayed quantization noise, and the second intermediate signal $X_2$ comprises delayed quantization noise.

Integrator 114 may be implemented with an amplifier having an input offset of $OS_1$, which may be modeled as a DC input of $OS_1$ to an ideal integrator. Similarly, integrator 118 may be implemented with an amplifier having an input offset of $OS_2$, which may be modeled as a DC input of $OS_2$ to an ideal integrator. Quantizer 122 may be implemented with one or more comparators having an input offset of $OS_3$, which may be modeled as a DC input of $OS_3$ to an ideal quantizer. The intermediate signals and the output signal in ΔΣ modulator 100 may then be expressed as:

$$V = U + (1-z^{-1})^2 \cdot E + OS_1, \qquad \text{Eq (5)}$$

$$X_1 = -z^{-1} \cdot (1-z^{-1}) \cdot E - OS_2, \text{ and} \qquad \text{Eq (6)}$$

$$X_2 = -z^{-2} \cdot E + OS_1 + 2OS_2 - OS_3. \qquad \text{Eq (7)}$$

As shown in equations (5) to (7), the input offsets $OS_1$, $OS_2$ and $OS_3$ are reflected in the intermediate signals as well as the output signal. The second intermediate signal $X_2$ from the second integrator 118 includes a DC offset comprising all three input offsets, or $OS_1+2OS_2-OS_3$. This DC offset may be relatively large and may degrade the performance of ΔΣ modulator 100.

In an aspect, DC offset at a particular point in a ΔΣ modulator (or a feedback circuit) may be canceled with a slow integrator applied at that point. DC offset cancellation may improve the performance of the ΔΣ modulator.

Figure 2:
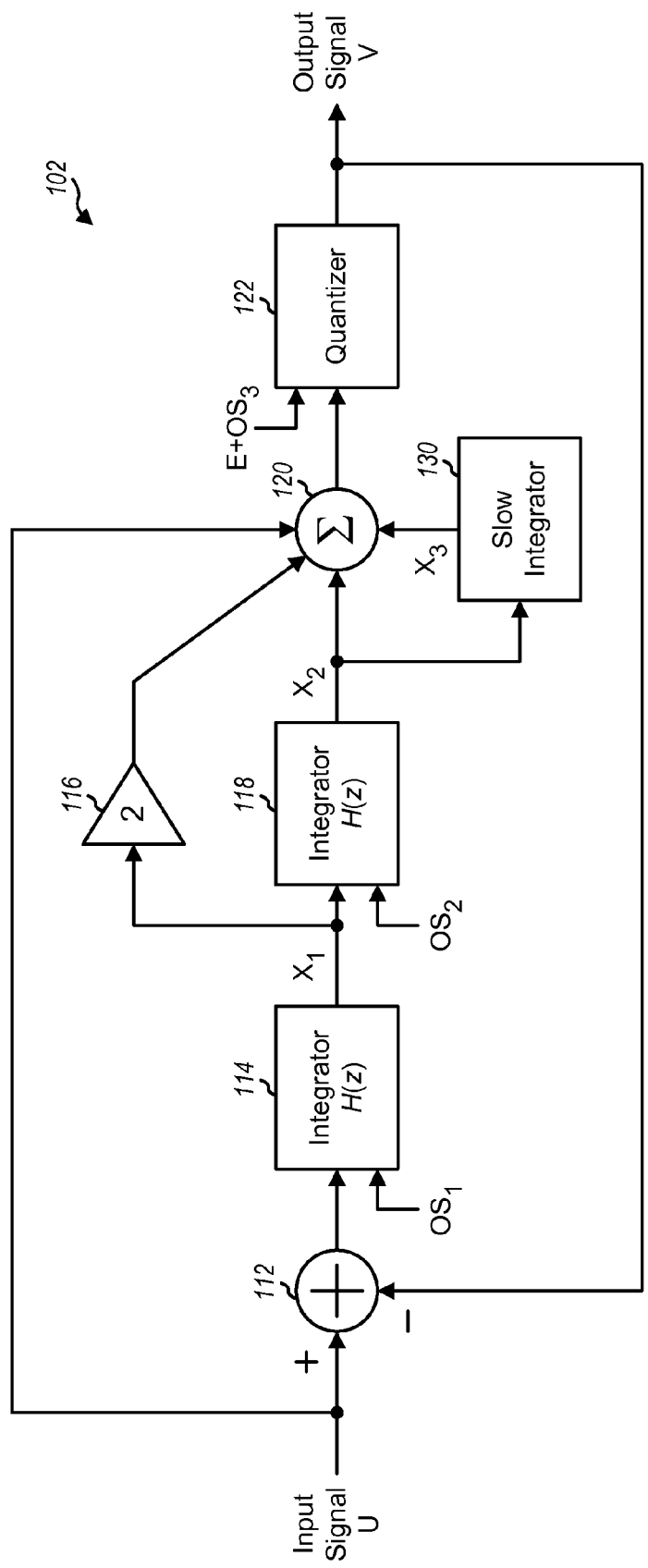
FIG. 2 shows a single-stage ΔΣ modulator with DC offset cancellation.

FIG. 2 shows a block diagram of a design of a second-order CIFF ΔΣ modulator 102 with DC offset cancellation. ΔΣ modulator 102 includes all of the circuit blocks in ΔΣ modulator 100 in FIG. 1. ΔΣ modulator 102 further includes a slow integrator 130 for DC offset cancellation. Slow integrator 130 receives the second intermediate signal $X_2$ and provides a third intermediate signal $X_3$. Summer 120 sums the analog input signal U, the output of multiplier 116, the second intermediate signal from integrator 118, and the third intermediate signal from slow integrator 130 and provides its output to quantizer 122.

Slow integrator 130 has a transfer function of $H_{slow}(z)$, which may be expressed as:

$$H_{slow}(z) = \frac{k \cdot z^{-1}}{1 - z^{-1}}, \qquad \text{Eq (8)}$$

where k is a gain for slow integrator 130. The gain k may be selected as 0<k<<1 to obtain a slow integrator. For example, the gain k may be set to 0.1, 0.01, 0.001, or some other small value. In general, smaller gain k may result in smaller effect on the loop response but may take longer time to cancel DC offset.

The intermediate signals and the output signal in ΔΣ modulator 102 may be expressed as:

$$V = U + (1-z^{-1})^2 \cdot E/D + OS_1, \qquad \text{Eq (9)}$$

$$X_1 = -z^{-1} \cdot (1-z^{-1}) \cdot E/D - OS_2, \qquad \text{Eq (10)}$$

$$X_2 = -z^{-2} \cdot E/D, \qquad \text{Eq (11)}$$

$$X_3 = -\frac{k \cdot z^{-3} \cdot E}{(1-z^{-1}) \cdot D} + OS_1 + 2OS_2 - OS_3, \text{ and} \qquad \text{Eq (12)}$$

$$D = 1 + \frac{k \cdot z^{-3}}{1 - z^{-1}}. \qquad \text{Eq (13)}$$

D denotes a transfer function due to slow integrator 130. The transfer function D approaches 1 as the gain k approaches 0.

As shown in equations (9) to (11), for 0<k<<1, the transfer functions for ΔΣ modulator 102 with slow integrator 130 is similar to the transfer functions for ΔΣ modulator 100 without a slow integrator, except that the DC offset is shifted from the second intermediate signal $X_2$ from second integrator 118 to the third intermediate signal $X_3$ from slow integrator 130. As shown in equations (11) and (12), the third intermediate signal $X_3$ slowly settles to a DC offset of $OS_1+2OS_1-OS_3$ while the DC offset of the second intermediate signal $X_2$ goes to zero. This is achieved with a high DC gain of slow integrator 130 and the close loop operation of the feedback circuit for ΔΣ modulator 102. Slow integrator 130 causes little change to the overall transfer function of ΔΣ modulator 102.

Slow integrator 130 increases the order of ΔΣ modulator 102 by one for very low frequency signal components but has small effect on mid to high frequency signal components. Since the order of ΔΣ modulator 102 is increased by one for very low frequency, DC offset at the output of the second integrator 118 due to input offsets $OS_1$, $OS_2$ and $OS_3$ is transferred to the output of slow integrator 130. The DC offset at the output of the second integrator 118 is thus canceled or reduced.

FIG. 2 shows a design in which slow integrator 130 is used to cancel the DC offset in the output of the second integrator 118, which may have a relatively largest DC offset due to the input offsets of the integrators and quantizer in ΔΣ modulator 102. The DC offsets in the outputs of the first integrator 114, summer 120, and quantizer 122 are similar for both ΔΣ modulators 100 and 102, as shown in equations (5) to (7) for ΔΣ modulator 100 and equations (9) to (11) for ΔΣ modulator 102. In general, DC offset in an output of a circuit block (e.g., an integrator) may be reduced with a slow integrator and a summer located after the circuit block. For example, a slow integrator may receive the first intermediate signal $X_1$ from the first integrator 114 and may provide its output to either summer 120 or a summer placed between integrators 114 and 118.

Slow integrator 130 may have an input offset, which may be modeled as a DC input of $OS_4$ to an ideal integrator. The input offset of slow integrator 130 may be reflected in the second intermediate signal from second integrator 118, which may be expressed as:

$$X_2 = -z^{-2} \cdot E/D + OS_4. \qquad \text{Eq (14)}$$

The input offset of slow integrator 130 may be calibrated and removed. In one design, the second intermediate signal $X_2$ may be filtered to obtain a DC component, which may correspond to the input offset of slow integrator 130. The input offset of slow integrator 130 may then be calibrated and removed, e.g. by varying the sizes of input transistors in slow integrator 130.

FIGS. 1 and 2 show single-stage second-order ΔΣ modulators 100 and 102 with a single quantizer. Higher order ΔΣ modulators may be implemented with more integrators coupled in cascade. ΔΣ modulators with more bits and/or higher order may also be implemented with the MASH topology.

Figure 3:
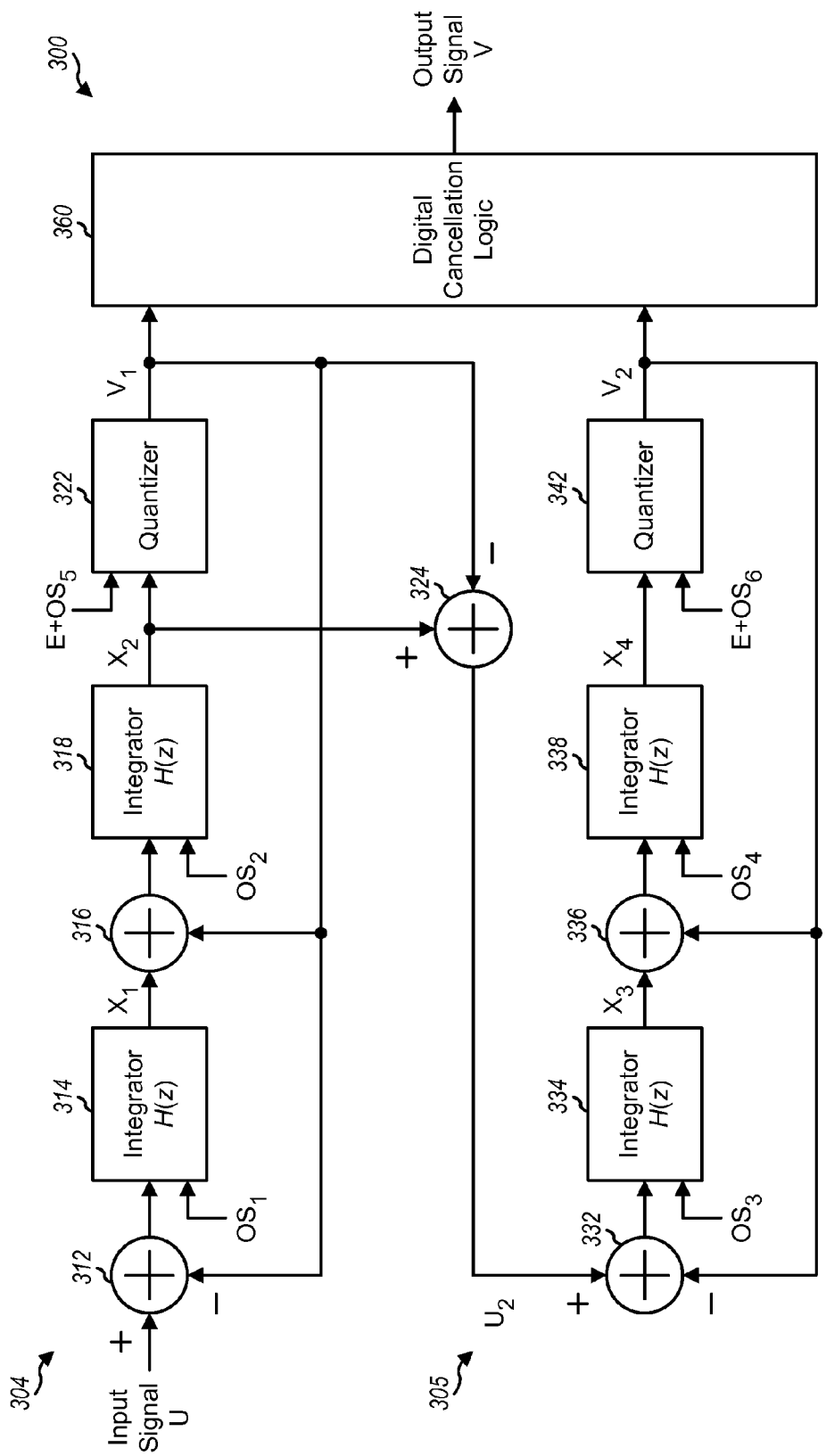
FIG. 3 shows a multi-stage ΔΣ modulator without DC offset cancellation.

FIG. 3 shows a block diagram of a two-stage MASH ΔΣ modulator 300 without DC offset cancellation. For a first stage 304 of ΔΣ modulator 300, a summer 312 receives an analog input signal U and a first digital output signal $V_1$ from a quantizer 322, subtracts the first output signal from the analog input signal, and provides a first error signal. A first integrator 314 integrates the first error signal and provides a first intermediate signal $X_1$. A summer 316 sums the first intermediate signal and the first output signal and provides its output to a second integrator 318. Second integrator 318 integrates the output of summer 316 and provides a second intermediate signal $X_2$ to quantizer 322. Quantizer 322 quantizes the second intermediate signal and provides the first output signal. A summer 324 subtracts the first output signal from the second intermediate signal and provides a second input signal $U_2$ to a second stage 305 of ΔΣ modulator 300.

For the second stage 305, a summer 332 subtracts a second digital output signal $V_2$ from the second input signal and provides a second error signal. A third integrator 334 integrates the second error signal and provides a third intermediate signal $X_3$. A summer 336 sums the third intermediate signal and the second output signal and provides its output to a fourth integrator 338. Fourth integrator 338 integrates the output of summer 336 and provides a fourth intermediate signal $X_4$ to a quantizer 342. Quantizer 342 quantizes the fourth intermediate signal and provides the second output signal. A digital cancellation logic 360 receives the first output signal $V_1$ from the first stage 304 and the second output signal $V_2$ from the second stage 305, combines the first and second output signals, and provide a final digital output signal V.

As shown in FIG. 3, there may be input offsets in various circuit blocks within ΔΣ modulator 300. Integrator 314, 318, 334 and 338 may have input offsets of $OS_1$, $OS_2$, $OS_3$ and $OS_4$, respectively. Quantizers 322 and 342 may have input offsets of $OS_5$ and $OS_6$, respectively. The input offsets $OS_1$, $OS_2$ and $OS_5$ for integrators 314 and 318 and quantizer 322, respectively, may be reflected in the second intermediate signal $X_2$ from integrator 318 as well as the second input signal $U_2$ provided to the second stage 305. The second intermediate signal and the second input signal may have relatively large DC offsets due to input offsets $OS_1$, $OS_2$ and $OS_5$. The large DC offsets may degrade the performance of ΔΣ modulator 300.

Figure 4:
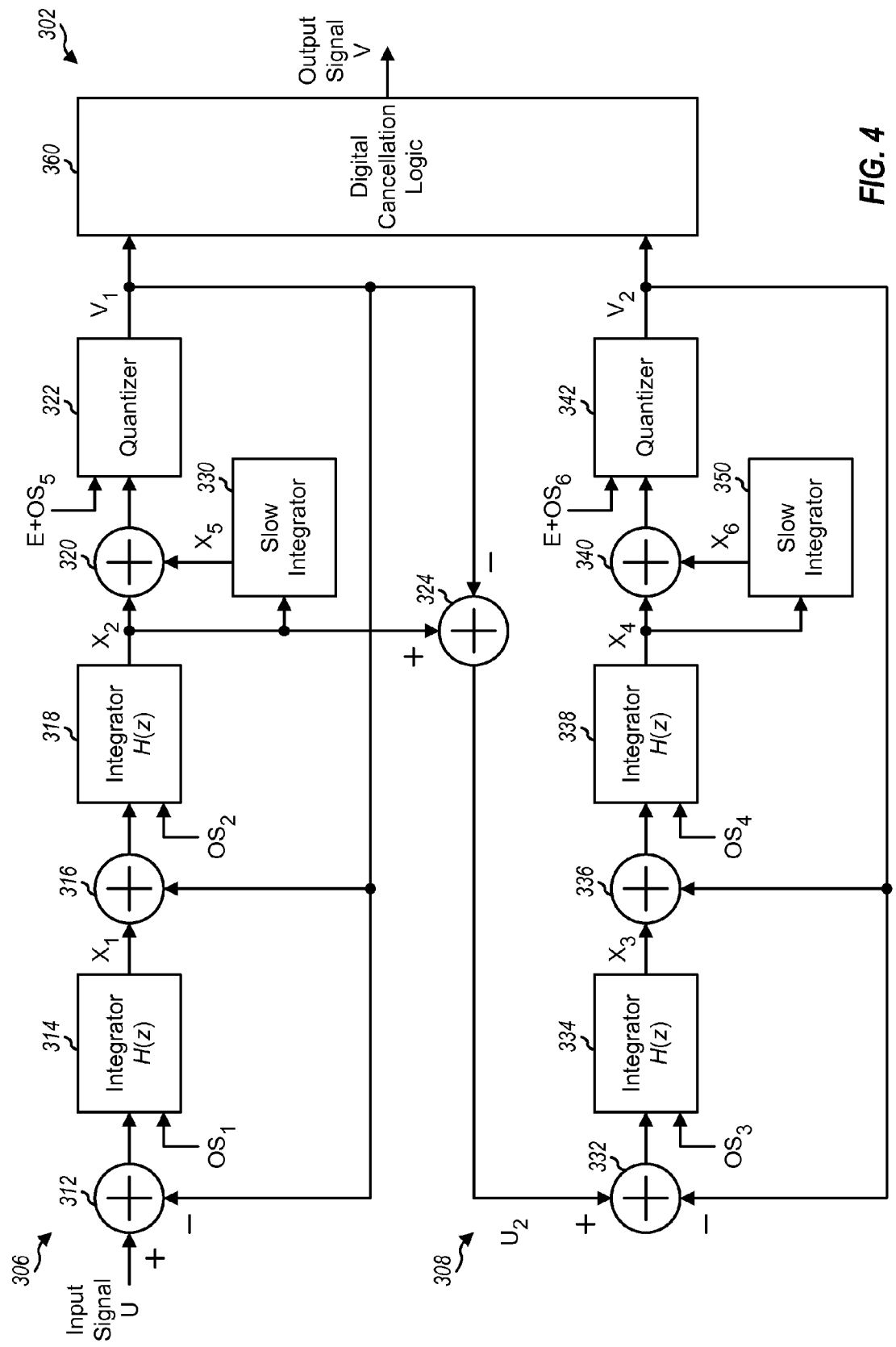
FIG. 4 shows a multi-stage ΔΣ modulator with DC offset cancellation.

FIG. 4 shows a block diagram of a design of a two-stage MASH ΔΣ modulator 302 with DC offset cancellation. ΔΣ modulator 302 includes all of the circuit blocks in ΔΣ modulator 300 in FIG. 3. ΔΣ modulator 302 further includes slow integrators 330 and 350 and summers 332 and 352 for DC offset cancellation.

For DC offset cancellation in a first stage 306, slow integrator 330 receives the second intermediate signal $X_2$ from integrator 318 and provides a fifth intermediate signal $X_5$. Summer 320 sums the second and fifth intermediate signals and provides its output to quantizer 322. Slow integrator 330 and summer 320 may be able to reduce DC offset in the second intermediate signal due to input offsets $OS_1$, $OS_2$ and $OS_5$. The DC offset in the second intermediate signal may approach zero.

For DC offset cancellation in a second stage 308, slow integrator 350 receives the fourth intermediate signal $X_4$ from integrator 338 and provides a sixth intermediate signal $X_6$. Summer 340 sums the fourth and sixth intermediate signals and provides its output to quantizer 342. Slow integrator 350 and summer 340 may be able to reduce DC offset in the fourth intermediate signal due to input offsets $OS_3$, $OS_4$ and $OS_6$. The DC offset in the fourth intermediate signal may approach zero.

FIG. 4 shows a design in which slow integrators 330 and 350 are used to cancel the DC offsets in the outputs of integrators 318 and 338, respectively. DC offsets in the outputs of integrator 314 and 334 may also be canceled with slow integrators and summers located after these integrators.

FIGS. 2 and 4 show an exemplary single-stage ΔΣ modulator 102 and an exemplary two-stage ΔΣ modulator 302 with DC offset cancellation. In general, DC offset cancellation may be performed for a ΔΣ modulator with any number of stages, any order, and any topology. DC offset cancellation may be performed at one or more points in the ΔΣ modulator, e.g., at each point in which low or no DC offset is desired, such as the output of the last integrator in each stage. DC offset cancellation at each point may be performed with a slow integrator coupled to that point and a summer placed after that point.

DC offset cancellation may be performed for ΔΣ modulators, as described above. DC offset cancellation may also be performed for other types of feedback circuits.

Figure 5:
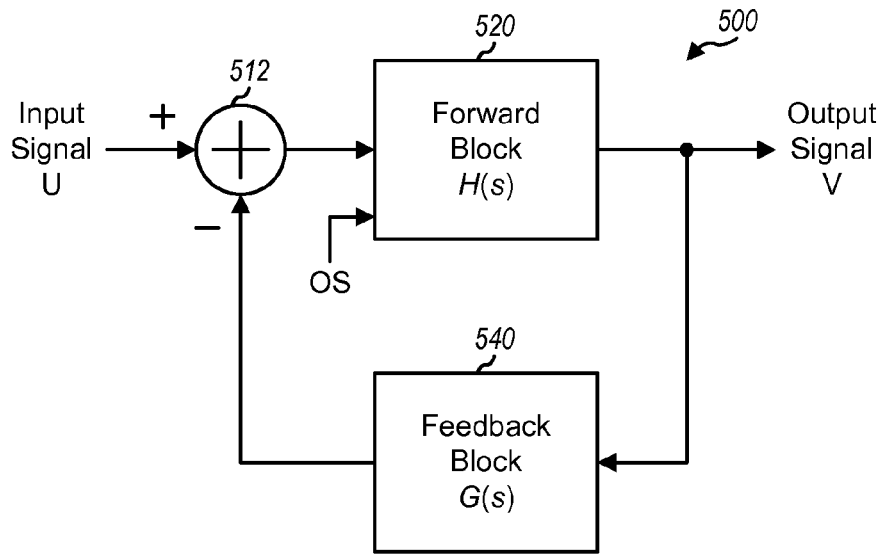
FIG. 5 shows a feedback circuit without DC offset cancellation.

FIG. 5 shows a block diagram of a feedback circuit 500 without DC offset cancellation. Within feedback circuit 500, a summer 512 receives an input signal U and a feedback signal from a feedback block 540, subtracts the feedback signal from the input signal, and provides an error signal. A forward block 520 processes the error signal with a transfer function of H(s) and provides an output signal V. Feedback block 540 processes the output signal with a transfer function of G(s) and provides the feedback signal. The transfer functions H(s) and G(s) may be selected to obtain the desired overall function for feedback circuit 500. For example, forward block 520 may include integrator 118 to quantizer 122 in FIG. 2, and feedback block 540 may include a direct connection so that G(s)=1.

As shown in FIG. 5, forward block 520 may have an input offset of OS, which may be reflected in the output signal. The input offset may degrade the performance of feedback circuit 500.

Figure 6:
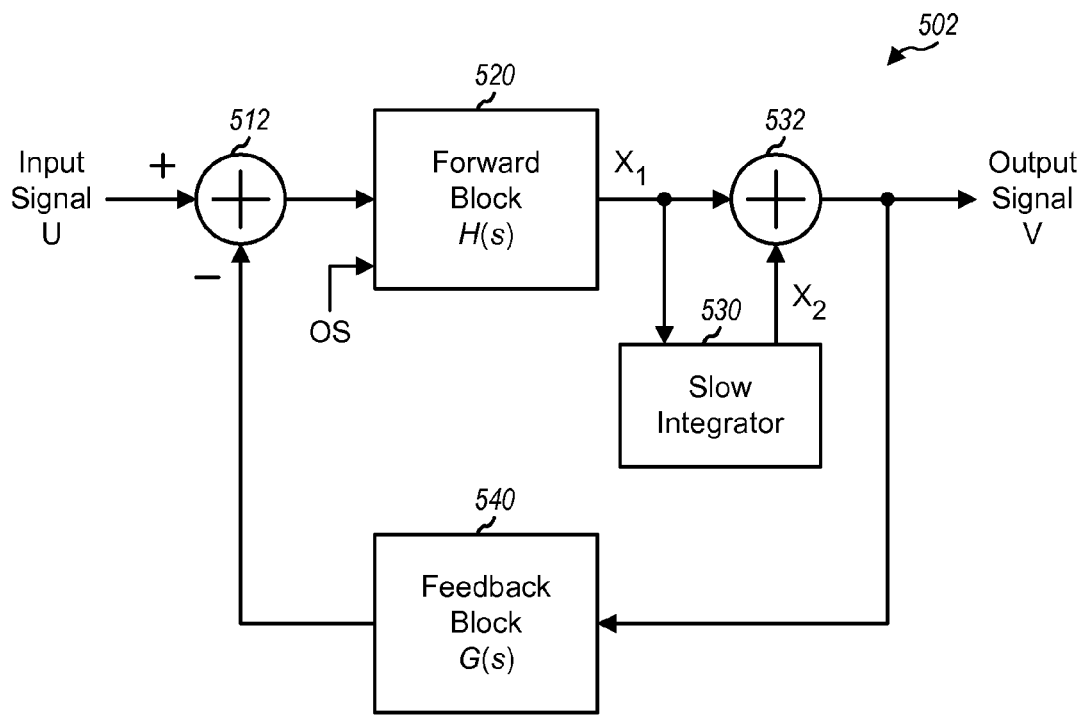
FIG. 6 shows a feedback circuit with DC offset cancellation.

FIG. 6 shows a block diagram of a design of a feedback circuit 502 with DC offset cancellation. Feedback circuit 502 includes all of the circuit blocks in feedback circuit 500 in FIG. 5. Feedback circuit 502 further includes a slow integrator 530 and a summer 532 for DC offset cancellation. Forward block 520 processes the error signal from summer 512 with the transfer function H(s) and provides a first intermediate signal $X_1$. Slow integrator 530 receives the first intermediate signal and provides a second intermediate signal $X_2$. Summer 532 sums the first and second intermediate signals. Slow integrator 530 and summer 532 may cancel DC offset in the first intermediate signal due to the input offset of forward block 520. The DC offset in the first intermediate signal may then approach zero. Summer 532 may provide the output signal V for feedback circuit 502, as shown in FIG. 6. Alternatively, forward block 520 may provide the output signal for feedback circuit 502 (not shown in FIG. 6).

FIG. 6 shows DC offset cancellation being performed at the output of forward block 520. In general, DC offset cancellation may be performed at any point in a feedback circuit. A slow integrator may receive a first intermediate signal at a point in the feedback circuit and may provide a second intermediate signal. A summer after that point may sum the first and second intermediate signals to reduce DC offset in the first intermediate signal.

The feedback circuits with DC offset cancellation described herein may provide various advantages. The DC offset cancellation may operate in the background and may not require calibration at start-up. The slow integrator used for DC offset cancellation does not process the input signal and hence does not need to have good linearity. The complexity of the slow integrator may thus be very low. The DC offset cancellation may also be resilient to drift in DC offset due to operating conditions, e.g., temperature and power supply variations.

The feedback circuits with DC offset cancellation described herein may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. The use of the feedback circuits with DC offset cancellation in a wireless communication device, which may be a cellular phone or some other device, is described below.

Figure 7:
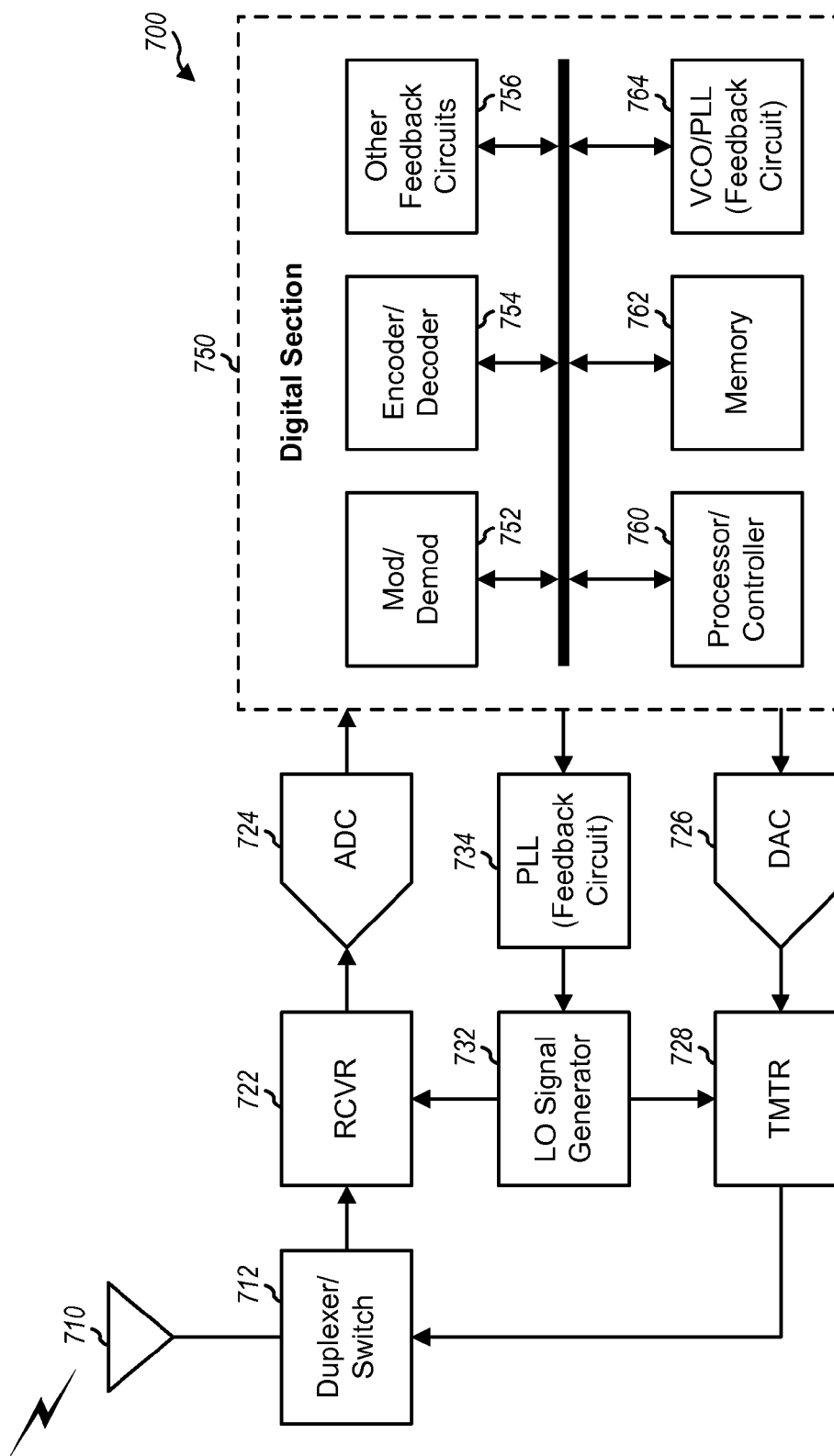
FIG. 7 shows a block diagram of a wireless communication device.

FIG. 7 shows a block diagram of a design of a wireless communication device 700. In the receive path, an antenna 710 receives signals transmitted by base stations and/or other transmitter stations and provides a received radio frequency (RF) signal, which is routed through a duplexer/switch 712 and provided to a receiver (RCVR) 722. Receiver 722 processes (e.g., amplifies, filters, and downconverts) the received RF signal and provides an input baseband signal. An ADC 724 digitizes the input baseband signal and provides input samples to a digital section 750. ADC 724 may be a ΔΣ ADC comprising a ΔΣ modulator with DC offset cancellation, e.g., as shown in FIG. 2 or 4.

In the transmit path, digital section 750 processes data to be transmitted and provides output samples to a DAC 726. DAC 726 converts the output samples from digital to analog and provides an output baseband signal. DAC 726 may be a ΔΣ DAC comprising a ΔΣ modulator with DC offset cancellation. A transmitter (TMTR) 728 processes (e.g., amplifies, filters, and upconverts) the output baseband signal and provides an output RF signal, which is routed through duplexer/switch 712 and transmitted via antenna 710.

A local oscillator (LO) signal generator 732 generates and provides receive LO signals to receiver 722 and transmit LO signals to transmitter 728. A PLL 734 receives control information from digital section 750 and provides control signals to LO signal generator 732 to generate the transmit and receive LO signals at the proper frequencies. PLL 734 may be implemented with a feedback circuit with DC offset cancellation.

Within digital section 750, a modulator/demodulator (Mod/Demod) 752 performs modulation for data transmission and demodulation for data reception. An encoder/decoder 754 performs encoding for data transmission and decoding for data reception. A processor/controller 760 directs the operation of various processing units within wireless device 700. A memory 762 stores program codes and data for wireless device 700. A voltage controlled oscillator (VCO)/PLL 764 generates clock signals for the processing units within digital section 750. VCO/PLL 764 may include a feedback circuit with DC offset cancellation. Digital section 750 may also include other feedback circuits 756 with DC offset cancellation.

The circuit blocks in FIG. 7 may be implemented on one or more integrated circuits (ICs). For example, receiver 722 and transmitter 728 may be implemented on one or more analog ICs, RF ICs (RFICs), mixed-signal ICs, etc. ADC 724, DAC 726, and digital section 750 may be implemented on one or more application specific integrated circuits (ASICs) and other ICs.

In an exemplary design, an apparatus may include a feedback circuit that receives an input signal and provides an output signal. The feedback circuit may comprise a slow integrator and a summer, e.g., as shown in FIG. 6. The slow integrator may have a gain of less than one (e.g., less than 0.1 or less than 0.01), may receive a first intermediate signal at a particular point in the feedback circuit, and may provide a second intermediate signal. The summer may be located after the particular point and may receive and sum the first and second intermediate signals. DC offset in the first intermediate signal may be reduced due to the slow integrator. The feedback circuit may comprise a ΔΣ modulator, a PLL, etc.

In another exemplary design, an apparatus may comprise a ΔΣ modulator that receives an input signal and provides an output signal. The ΔΣ modulator may comprise at least one integrator coupled in cascade, a slow integrator, and a summer. The slow integrator may be coupled to the output of the last integrator, may receive a first intermediate signal from the last integrator, and may provide a second intermediate signal. The summer may be coupled to the last integrator and the slow integrator and may sum the first and second intermediate signals to reduce DC offset in the first intermediate signal. The slow integrator may be varied (e.g., the sizes of the input transistors of the slow integrator may be adjusted) to reduce input offset of the slow integrator.

In one design, the ΔΣ modulator may comprise two integrators coupled in cascade, e.g., as shown in FIG. 2. The slow integrator may be coupled to the output of the last integrator. In another design, the ΔΣ modulator may comprise multiple stages, e.g., as shown in FIG. 4. The first stage may comprise the at least one integrator coupled in cascade. The first intermediate signal may be used to generate a second input signal for the second stage. The second stage may comprise at least one additional integrator coupled in cascade, a second slow integrator, and a second summer coupled to the last integrator in the second stage, e.g., as shown in FIG. 4. The second slow integrator may be coupled to the output of the last integrator in the second stage, may receive a third intermediate signal from the last integrator in the second stage, and may provide a fourth intermediate signal. The second summer may be coupled to the last integrator in the second stage and the second slow integrator and may sum the third and fourth intermediate signals to reduce DC offset in the third intermediate signal.

The ΔΣ modulator may be implemented with a CIFF topology (e.g., as shown in FIG. 2), a MASH topology (e.g., as shown in FIG. 4), a CIFB topology, or some other topology. The ΔΣ modulator may be part of an ADC, a DAC, a PLL, etc. The apparatus may be a wireless communication device, an integrated circuit, or some other device.

Figure 8:
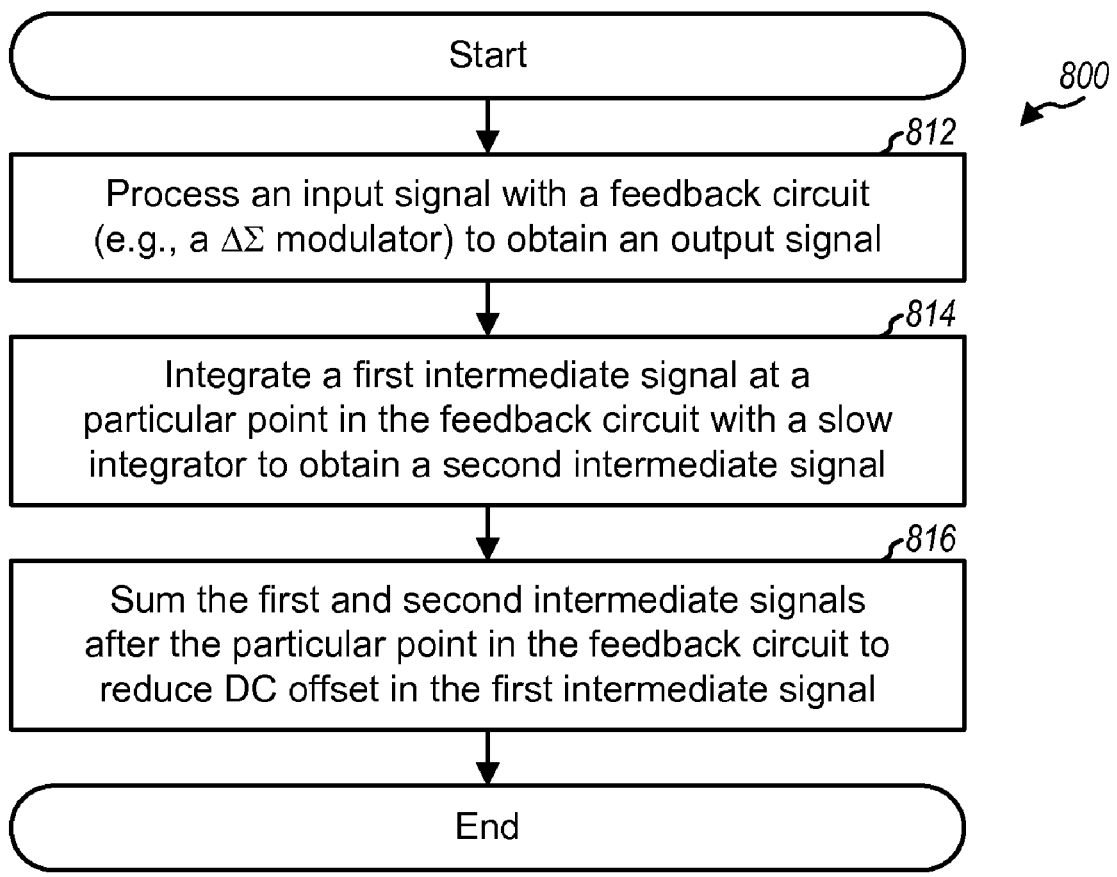
FIG. 8 shows a process for performing signal processing.

FIG. 8 shows a design of a process 800 for performing signal processing. An input signal may be processed with a feedback circuit (e.g., a ΔΣ modulator) to obtain an output signal (block 812). A first intermediate signal at a particular point in the feedback circuit may be integrated with a slow integrator (e.g., having a gain of less than one) to obtain a second intermediate signal (block 814). The first intermediate signal may be from the last integrator in the ΔΣ modulator. The first and second intermediate signals may be summed after the particular point in the feedback circuit to reduce DC offset in the first intermediate signal (block 816).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for signal processing, comprising:
  a feedback circuit configured to receive an input signal and provide an output signal, the feedback circuit comprising
    a slow integrator configured to receive a first intermediate signal at a particular point in the feedback circuit and provide a second intermediate signal, wherein the slow integrator has a gain of less than one, and
    a summer located after the particular point and configured to receive and sum the first and second intermediate signals to reduce direct current (DC) offset in the first intermediate signal.

2. The apparatus of claim 1, wherein the feedback circuit comprises a delta-sigma (ΔΣ) modulator.

3. The apparatus of claim 2, wherein the ΔΣ modulator comprises at least one integrator coupled in cascade, and wherein the particular point is at an output of a last integrator in the ΔΣ modulator.

4. The apparatus of claim 1, wherein the feedback circuit comprises a phase locked loop (PLL).

5. The apparatus of claim 1, wherein the slow integrator has a gain of less than 0.1.

6. An apparatus for signal processing, comprising:
  a delta-sigma (ΔΣ) modulator configured to receive an input signal and provide an output signal, the ΔΣ modulator comprising
    at least one integrator coupled in cascade,
    a slow integrator coupled to an output of a last integrator among the at least one integrator and configured to receive a first intermediate signal from the last integrator and provide a second intermediate signal, wherein the slow integrator has a gain of less than one, and a summer coupled to the last integrator and the slow integrator and configured to sum the first and second intermediate signals to reduce direct current (DC) offset in the first intermediate signal.

7. The apparatus of claim 6, wherein the ΔΣ modulator comprises two integrators coupled in cascade, and wherein the slow integrator is coupled to the output of the last integrator among the two integrators.

8. The apparatus of claim 6, wherein the ΔΣ modulator comprises first and second stages, wherein the first stage comprises the at least one integrator coupled in cascade, and wherein the first intermediate signal is used to generate a second input signal for the second stage.

9. The apparatus of claim 8, wherein the second stage comprises
at least one additional integrator coupled in cascade,
a second slow integrator coupled to an output of a last integrator in the second stage and configured to receive a third intermediate signal from the last integrator in the second stage and provide a fourth intermediate signal, and
a second summer coupled to the last integrator in the second stage and the second slow integrator and configured to sum the third and fourth intermediate signals to reduce DC offset in the third intermediate signal.

10. The apparatus of claim 6, wherein the ΔΣ modulator is implemented with a cascade of integrators feed-forward (CIFF) topology.

11. The apparatus of claim 6, wherein the ΔΣ modulator is implemented with a multi-stage noise shaping (MASH) topology.

12. The apparatus of claim 6, wherein the slow integrator is varied to reduce input offset of the slow integrator.

13. The apparatus of claim 6, wherein the ΔΣ modulator is part of an analog-to-digital converter (ADC).

14. The apparatus of claim 6, wherein the ΔΣ modulator is part of a digital-to-analog converter (DAC).

15. The apparatus of claim 6, wherein the apparatus is a wireless communication device.

16. The apparatus of claim 6, wherein the apparatus is an integrated circuit.

17. A method of performing signal processing, comprising:
processing an input signal with a feedback circuit to obtain an output signal;
integrating a first intermediate signal at a particular point in the feedback circuit with a slow integrator to obtain a second intermediate signal, wherein the slow integrator has a gain of less than one; and
summing the first and second intermediate signals after the particular point in the feedback circuit to reduce direct current (DC) offset in the first intermediate signal.

18. The method of claim 17, wherein the processing the input signal comprises processing the input signal with a delta-sigma (ΔΣ) modulator to obtain the output signal.

19. The method of claim 18, wherein the integrating the first intermediate signal comprises integrating the first intermediate signal from a last integrator in the ΔΣ modulator.

20. The method of claim 17, wherein the integrating the first intermediate signal comprises integrating the first intermediate signal with the slow integrator having a gain of less than 0.1.

21. An apparatus for signal processing, comprising:
means for processing an input signal with a feedback circuit to obtain an output signal;
means for slowly integrating a first intermediate signal at a particular point in the feedback circuit to obtain a second intermediate signal, wherein the means for slowly integrating the first intermediate signal comprises means for slowly integrating the first intermediate signal with a gain of less than one; and
means for summing the first and second intermediate signals after the particular point in the feedback circuit to reduce direct current (DC) offset in the first intermediate signal.

22. The apparatus of claim 21, wherein the means for processing the input signal comprises means for processing the input signal with a delta-sigma (ΔΣ) modulator to obtain the output signal.

23. The apparatus of claim 22, wherein the means for slowly integrating the first intermediate signal comprises means for slowly integrating the first intermediate signal from a last integrator in the ΔΣ modulator.

24. The apparatus of claim 21, wherein the means for slowly integrating the first intermediate signal comprises means for slowly integrating the first intermediate signal with a gain of less than 0.1.

25. A non-transitory computer-readable medium storing a computer program, wherein execution of the computer program is for:
processing an input signal with a feedback circuit to obtain an output signal,
slowly integrating a first intermediate signal with a gain of less than one at a particular point in the feedback circuit to obtain a second intermediate signal, and
summing the first and second intermediate signals after the particular point in the feedback circuit to reduce direct current (DC) offset in the first intermediate signal.

* * * * *